United States Patent
Chen et al.

(10) Patent No.: US 6,727,159 B2
(45) Date of Patent: Apr. 27, 2004

(54) METHOD OF FORMING A SHALLOW TRENCH ISOLATION IN A SEMICONDUCTOR SUBSTRATE

(75) Inventors: Yi-Nan Chen, Taipei (TW); Hsien-Wen Liu, Tainan (TW); Kaan-Lu Tzou, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/163,239

(22) Filed: Jun. 4, 2002

(65) Prior Publication Data

US 2003/0143854 A1 Jul. 31, 2003

(30) Foreign Application Priority Data

Jan. 28, 2002 (TW) .......................... 91101348 A

(51) Int. Cl.[7] .............................................. H01L 21/76
(52) U.S. Cl. ........................................................ 438/435
(58) Field of Search ................................. 438/435, 424, 438/437, 445

(56) References Cited

U.S. PATENT DOCUMENTS 6,146,974 A    11/2000  Liu et al. .................... 438/435
6,235,606 B1 *  5/2001  Huang et al. ................ 438/400
6,326,282 B1 * 12/2001  Park et al. ................... 438/424
6,576,530 B1 *  6/2003  Chen et al. .................. 438/435

* cited by examiner

*Primary Examiner*—David Nelms
*Assistant Examiner*—Quoc Hoang
(74) *Attorney, Agent, or Firm*—Ladas & Parry

(57) ABSTRACT

A method of forming a shallow trench isolation in a semiconductor substrate. First, a hard mask consisting of a pad nitride and a pad oxide is formed on the semiconductor substrate. The semiconductor substrate is anisotrpically etched to form a trench while the hard mask is used as the etching mask. A thermal oxide film is grown on the trench. Then, a nitride liner is formed on the thermal oxide film. Next, a silicon rich oxide layer is conformally deposited on the nitride liner by high density plasma chemical vapor deposition without a bias voltage applied to the semiconductor substrate. Then, a silicon oxide is deposited to fill the trench by high density plasma chemical vapor deposition while a bias voltage is applied to the semiconductor substrate.

7 Claims, 8 Drawing Sheets

METHOD OF FORMING A SHALLOW TRENCH ISOLATION IN A SEMICONDUCTOR SUBSTRATE

BACKGROUND OF THE INVENTION

1. Field of the Invention

The present invention relates to the manufacture of a semiconductor device, more particularly to a method of forming a shallow trench isolation capable of preventing corner erosion of the shallow trench isolation so that the semiconductor device performance can be improved.

2. Description of the Related Art

As semiconductor device dimensions continue to shrink, local oxidation of silicon (LOCOS) isolation structure that has served the technology well into the submicron regime runs up against several foundational limitations. The extension of the "bird beak" taper into the active transistor areas becomes unavoidable as the maximum distance between active regions decreases. In addition, the lack of planarity creates problems, particularly as the sophistication of the interconnection scheme increases.

Shallow trench isolation (STI) formed by high density plasma chemical vapor deposition (HDPCVD) has been used to replace conventional local oxidation of silicon (LOCOS) in order to form improved field isolation structures.

One important advantage of HDPCVD is to effectively fill a dielectric material such as oxide so that the surface is planarized and void-free. However, there may be mechanisms of etching, sputtering, and deposition associated with the plasma technology. Therefore, a HDPCVD process for a oxide material does not only include deposition of oxide layer on the semiconductor substrate surface, but also etching of the semiconductor substrate and sputtering into the recess portion of the semiconductor substrate.

In order to protect the semiconductor substrate form damage by bombardment etching, a method of forming shallow trench isolation described in U.S. Pat. No. 6,146,974 is provided.

As shown in FIG. 1, a semiconductor substrate 10 made of single-crystalline silicon is provided. Next, a hard mask HM consisting of pad nitride 14 and pad oxide 12 is formed over the semiconductor substrate 10. The semiconductor substrate 100 is anisotropically etched to form a shallow trench 16 when the hard mask HM is used as the etching mask. Then, a thermal oxide film 18 is grown on the shallow trench 16 by thermal oxidation. A nitride liner 20 is deposited on the thermal oxide film 18 by chemical vapor deposition.

A silicon oxide 22 is conformally deposited on the nitride liner 20 by high density plasma chemical vapor deposition (HDPCVD) without a bias voltage applied to the semiconductor substrate 10. In this step, a mixture gas of silane and oxygen having a flow rate of about 1:2 is introduced into the deposition chamber. The conformal silicon oxide 22 has an etching rate higher than 690 angstroms/min using a hydrofluoric acid solution. A silicon oxide 24 is then deposited to fill the shallow trench 16 by high density plasma chemical vapor deposition (HDPCVD) while a bias voltage is applied to the semiconductor substrate 10. In this step, a mixture gas of silane and oxygen having a flow rate of about 1:2 is introduced into the deposition chamber. The silicon oxide 24 has an etching rate of about 300 angstroms/min using a hydrofluoric acid solution.

The silicon oxide 22, 24 and nitride liner 20 are planarized by chemical mechanical polishing while the hard mask HM is used as the polishing stop layer. Next, in order to remove native oxide on the pad nitride 14, the so-called deglaze step is conducted. That is to say, residual oxide (not shown) on the pad nitride 14 is removed by a hydrofluoric acid solution. The conformal silicon oxide 22 is lower than the silicon oxide 24 as shown as FIG. 1 after the deglaze step because the conformal silicon oxide 22 has a higher etching rate.

Next, as shown in FIG. 2, the pad nitride 14 of the hard mask HM is removed to expose the pad oxide 12 by a phosphorus acid solution. In this step, the nitride liner 20 formed on the shallow trench 16 is attacked so as to create a small channel 26 and leave a nitride liner 20a.

Afterward, as shown in FIG. 3, the pad oxide 12 is removed by a hydrofluoric acid etchant. In this step, the thermal oxide film 18 is attacked by the hydrofluoric acid etchant through the small channel 26 so as to create a recess 28 and leave a thermal oxide film 18a. Accordingly, the recess 28 can result in poor performance of the semiconductor device such as transistor formed in the subsequent step.

Therefore, a need exists in the industry for a shallow trench isolation process which eliminates corner erosion of shallow trench isolation thereby improving the semiconductor device performance.

SUMMARY OF THE INVENTION

In view of the above disadvantages, an object of the invention is to provide a method of forming a shallow trench isolation in a semiconductor substrate. According to the method, corner erosion of shallow trench isolation can be eliminated thus improving the performance of the semiconductor device.

Accordingly, the above objects are attained by providing a method of forming a shallow trench isolation in a semiconductor substrate. First, a hard mask consisting of a pad nitride and a pad oxide is formed on the semiconductor substrate. The semiconductor substrate is anisotrpically etched to form a shallow trench while the hard mask is used as the etching mask. A thermal oxide film is then grown on the trench. Then, a nitride liner is formed on the thermal oxide film. Next, a silicon rich oxide layer is conformally deposited on the nitride liner by high density plasma chemical vapor deposition without a bias voltage applied to the semiconductor substrate. Then, a silicon oxide is deposited to fill the trench by high density plasma chemical vapor deposition while a bias voltage is applied to the semiconductor substrate.

Furthermore, the deposition gases for the silicon rich oxide can include a mixture gas of silane and oxygen having a flow ratio of about 1:1.

Furthermore, the deposition gases for the silicon oxide can include a mixture gas of silane and oxygen having a flow ratio of about 1:1 to 1:2.

Furthermore, the silicon rich oxide layer has a hydrofluoric acid selectivity of about 1 or less than 1 relative to the silicon oxide layer.

Furthermore, this method can further comprise the steps of:
   planarizing the silicon rich oxide layer and the silicon oxide layer by chemical mechanical polishing while the hard mask is used as the polishing stop layer; and
   removing residual oxide above the hard mask by hydrofluoric acid.

Furthermore, the nitride liner is preferably a silicon nitride film formed by chemical vapor deposition.

DETAILED DESCRIPTION OF THE INVENTION

The following description will explain the method of forming a shallow trench isolation in a semiconductor substrate according to the preferred embodiments of the invention, which proceeds with reference to the accompanying drawings.

FIGS. 4 to 8 are cross-sections showing the manufacturing steps of forming a shallow trench isolation in a semiconductor substrate according to the preferred embodiment of the invention.

Figure 1:
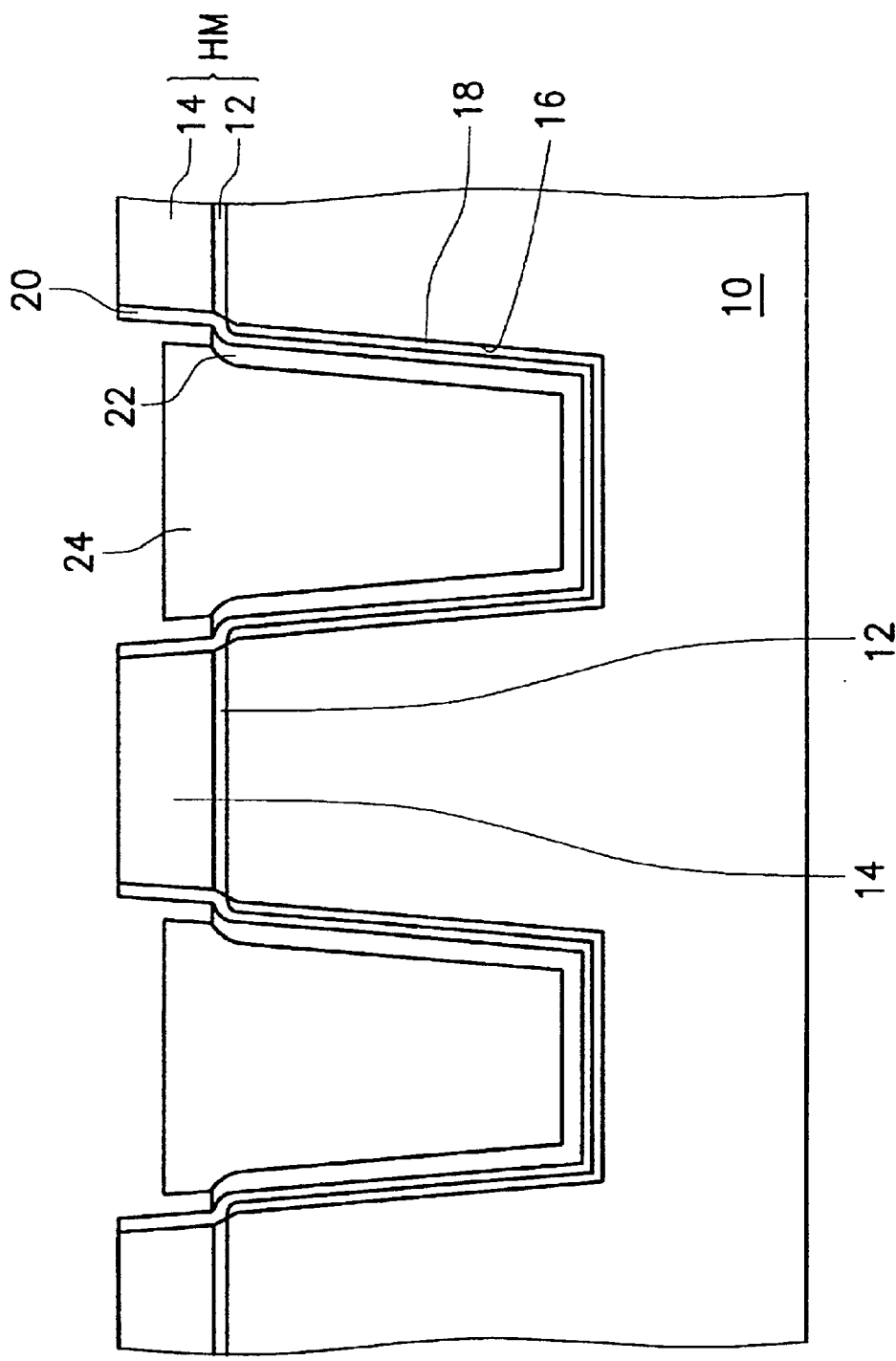
FIGS. 1 to 3 are cross-sections showing the manufacturing steps of forming a shallow trench isolation in a semiconductor substrate according to the prior art.
Figure 2:
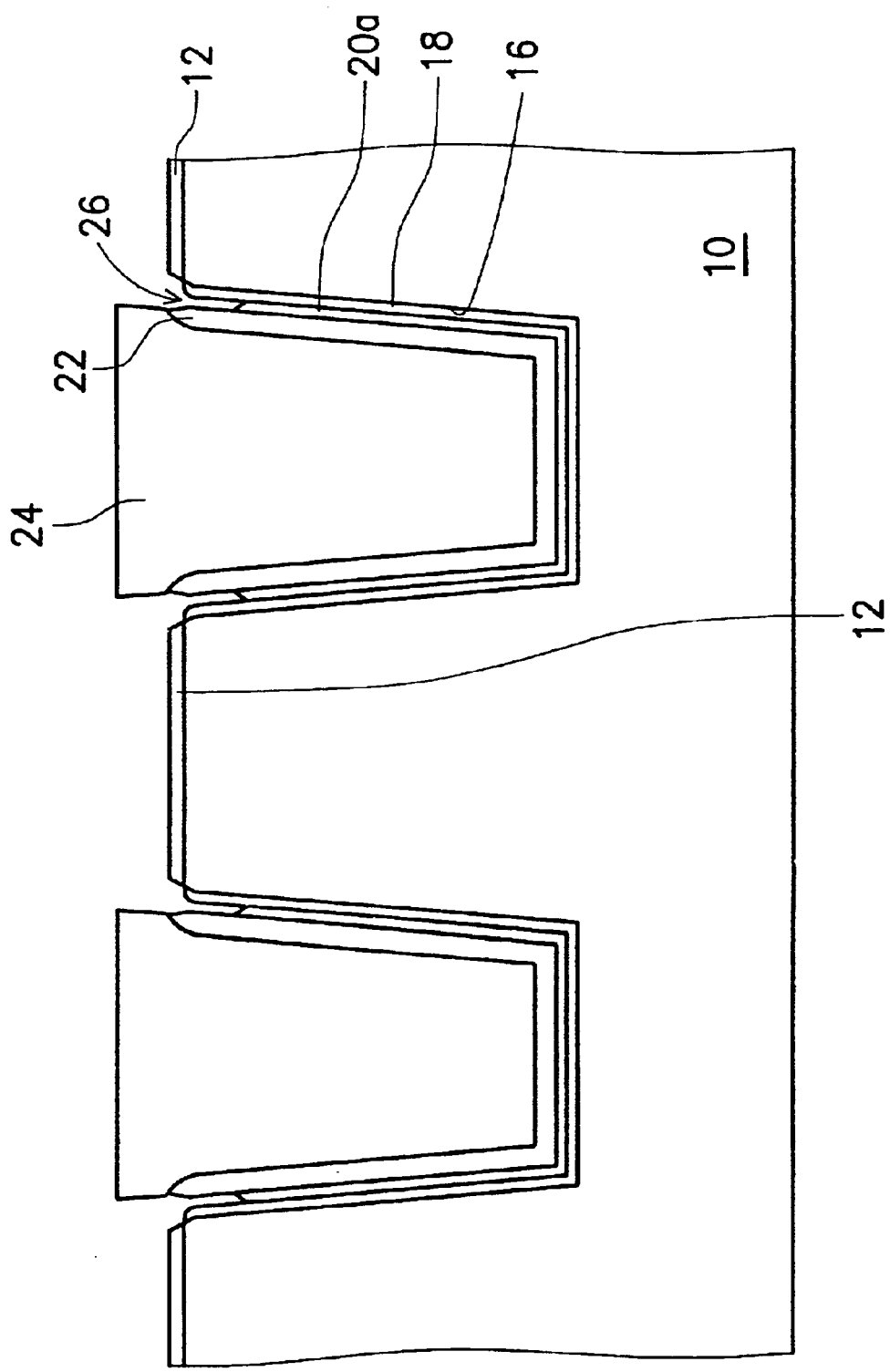
Figure 3:
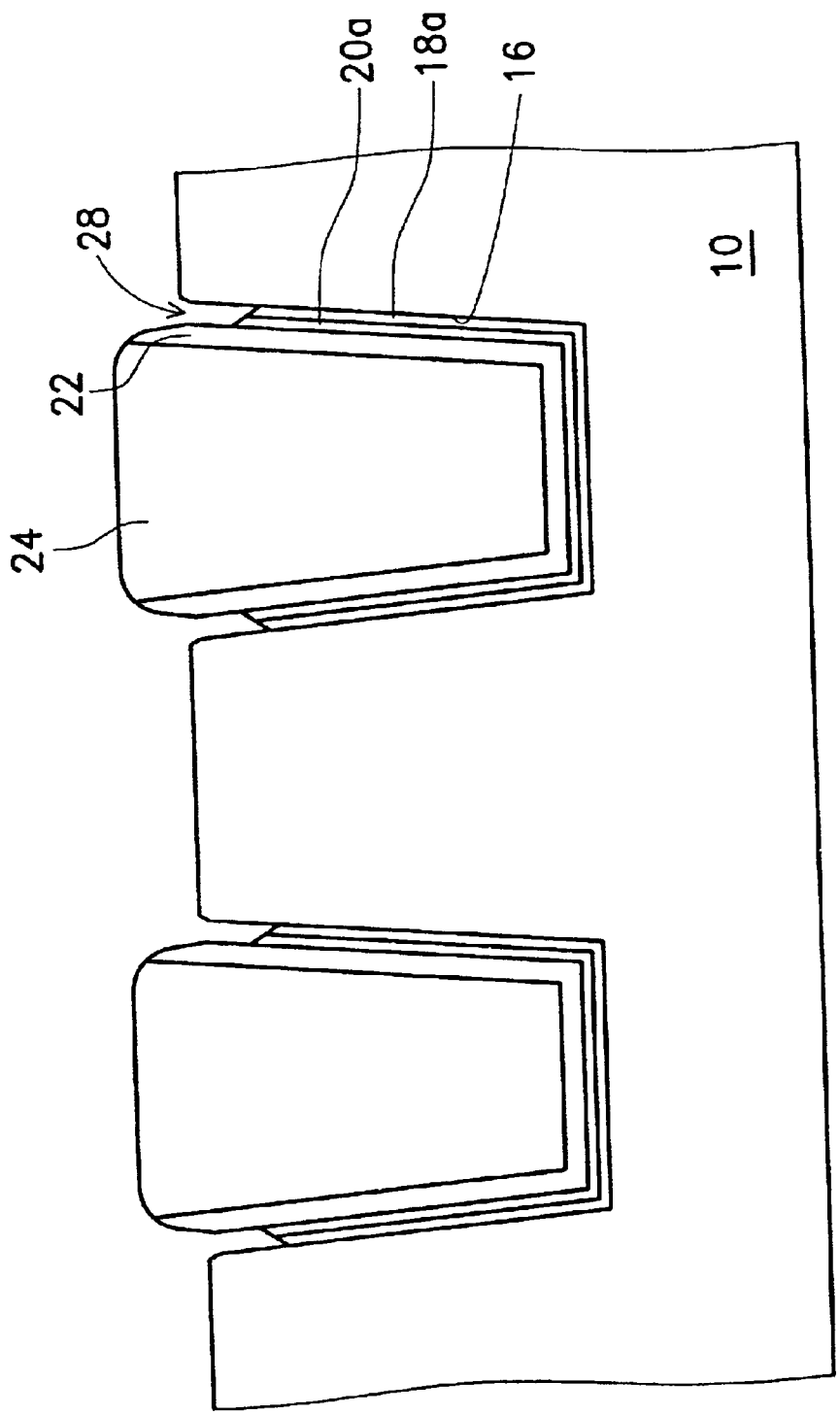
Figure 4:
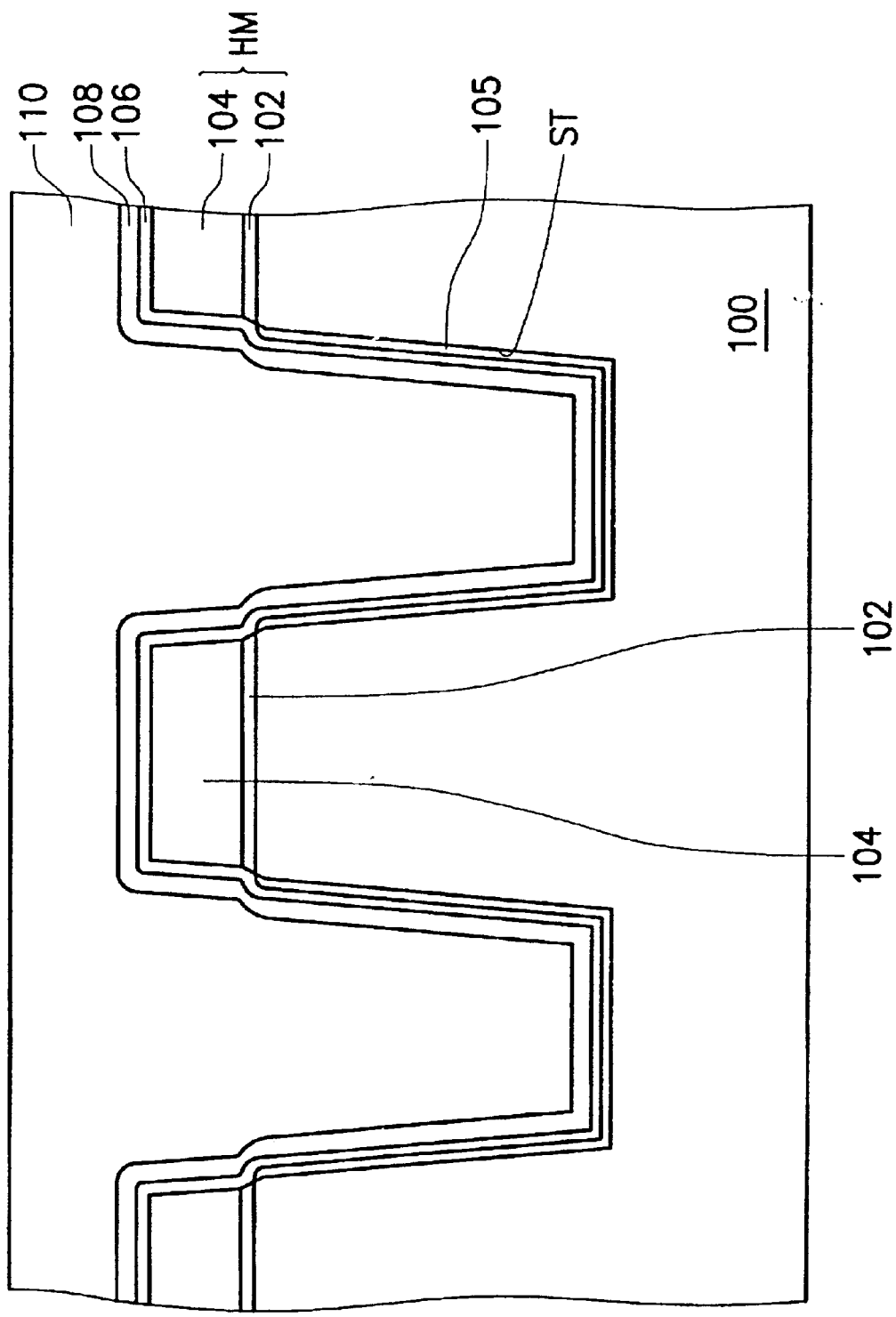
FIGS. 4 to 8 are cross-sections showing the manufacturing steps of forming a shallow trench isolation in a semiconductor substrate according to the preferred embodiment of the invention.

As shown in FIG. 4, a semiconductor substrate 100 made of single-crystalline silicon is provided. Next, a hard mask HM consisting of pad nitride 104 and pad oxide 102 is formed over the semiconductor substrate 100. The semiconductor substrate 100 is anisotropically etched to form a shallow trench ST while the hard mask HM is used as the etching mask. Then, a thermal oxide film 105 is grown on the shallow trench ST by thermal oxidation. A nitride liner 106 is deposited on the thermal oxide film 105 by chemical vapor deposition.

To prevent the nitride liner 106 from damage by bombardment etching, a silicon rich oxide 108 is conformally deposited on the nitride liner 106 by high density plasma chemical vapor deposition (HDPCVD) without a bias voltage applied to the semiconductor substrate 100. In this step, a mixture gas of silane and oxygen having a flow rate of about 1:1 is introduced into the deposition chamber. The silicon rich oxide 108 has an etching rate of about 300 angstroms/min using a hydrofluoric acid solution.

Next, a silicon oxide layer 110 is deposited to fill the shallow trench ST by high density plasma chemical vapor deposition (HDPCVD) while a bias voltage is applied to the semiconductor substrate 100. In this step, a mixture gas of silane and oxygen having a flow rate of about 1:2 is introduced into the deposition chamber. The silicon oxide 110 has an etching rate of about 300~320 angstroms/min using a hydrofluoric acid solution.

Figure 5:
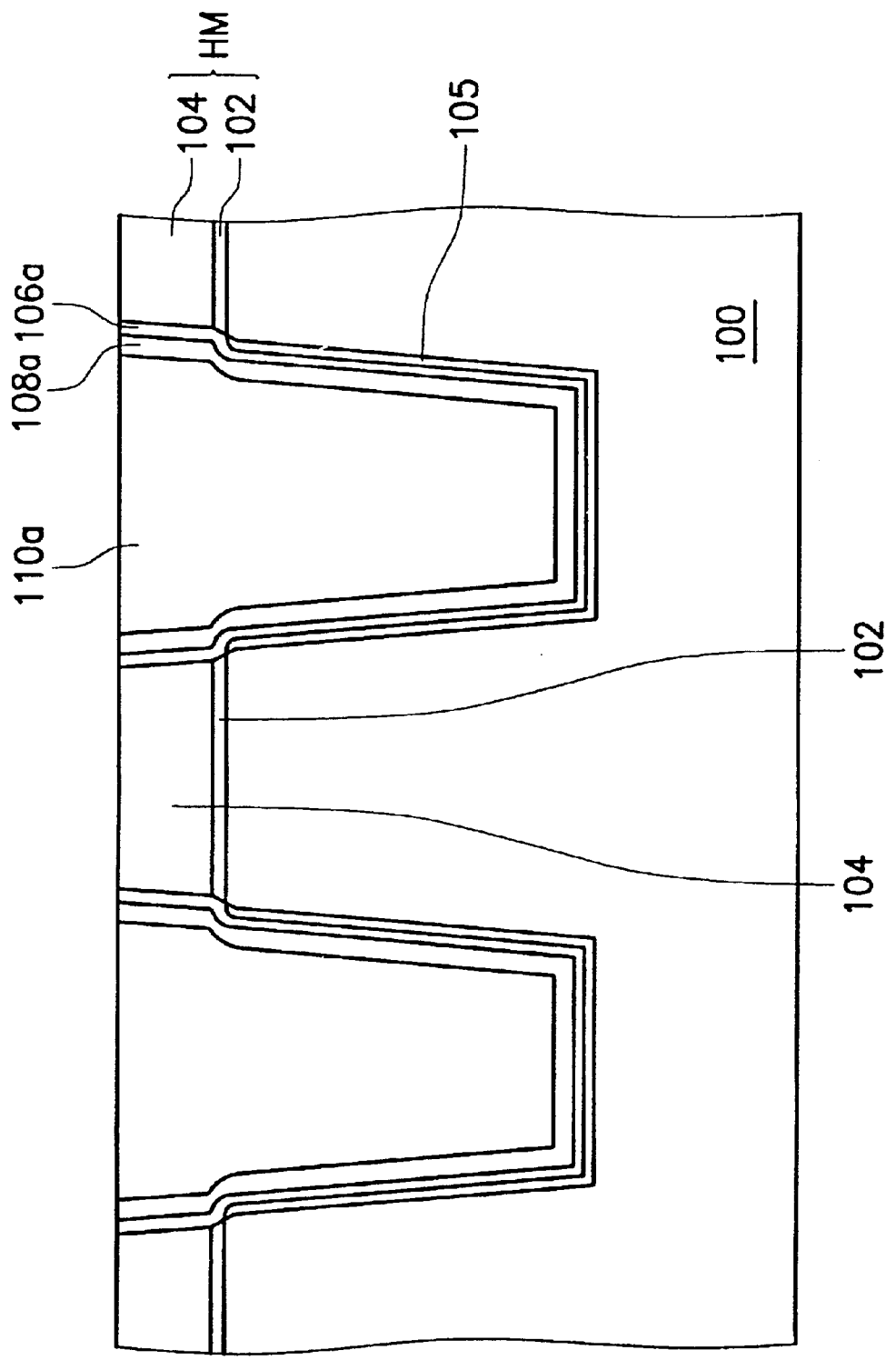
Figure 6:
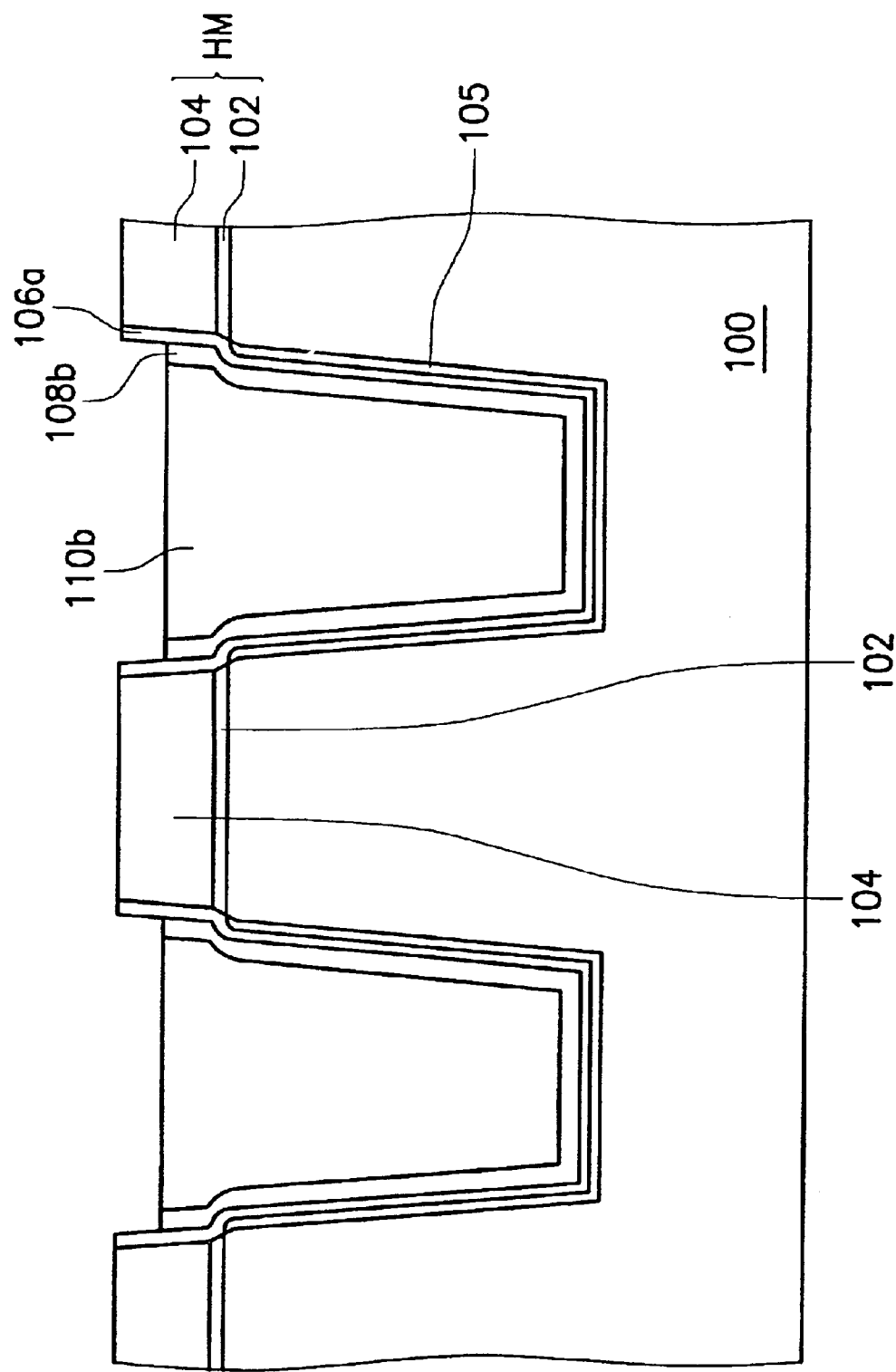

As shown in FIG. 5, the silicon oxide 110, silicon rich layer 108, and nitride liner 106 are planarized by chemical mechanical polishing while the hard mask HM is used as the polishing stop layer to leave silicon oxide 110a, silicon rich oxide 108a and nitride liner 106a. Next, referring now to FIG. 6, the so-called deglaze step is conducted. That is to say, residual oxide (not shown) on the pad nitride 104 is removed by a hydrofluoric acid solution. The silicon rich oxide 108a is almost coplanar with the silicon oxide 110a as shown in FIG. 6 because the silicon rich oxide 108a and the silicon oxide 110a tend to have similar chemical characteristics (have a similar etching rate).

Figure 7:
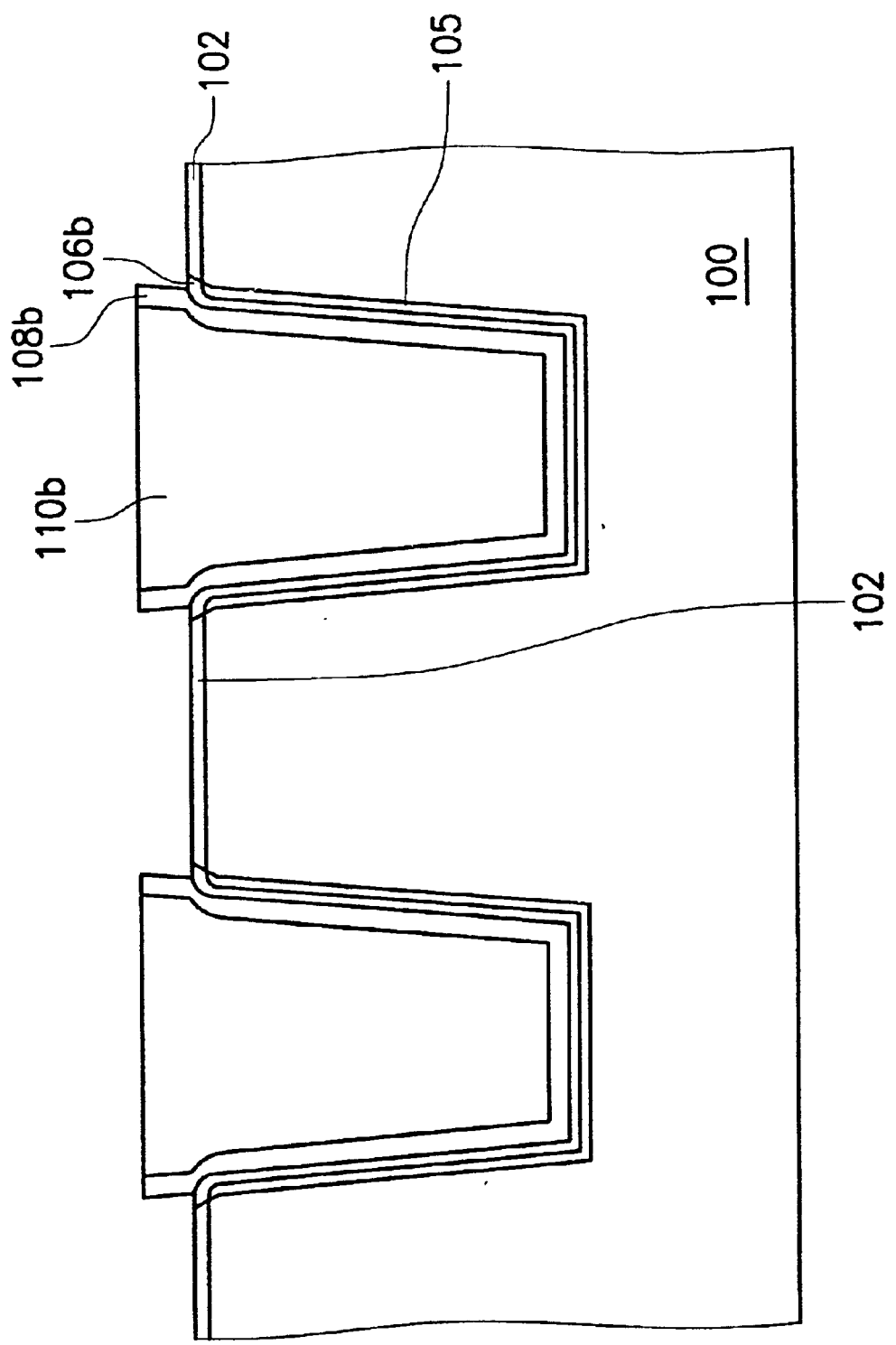

Next, as shown in FIG. 7, the pad nitride 104 of the hard mask HM is removed to expose the pad oxide 102 by a phosphorus acid solution. In this step, the nitride liner 106a covered by silicon rich oxide 108a is partially etched to leave nitride liner 106b.

Figure 8:
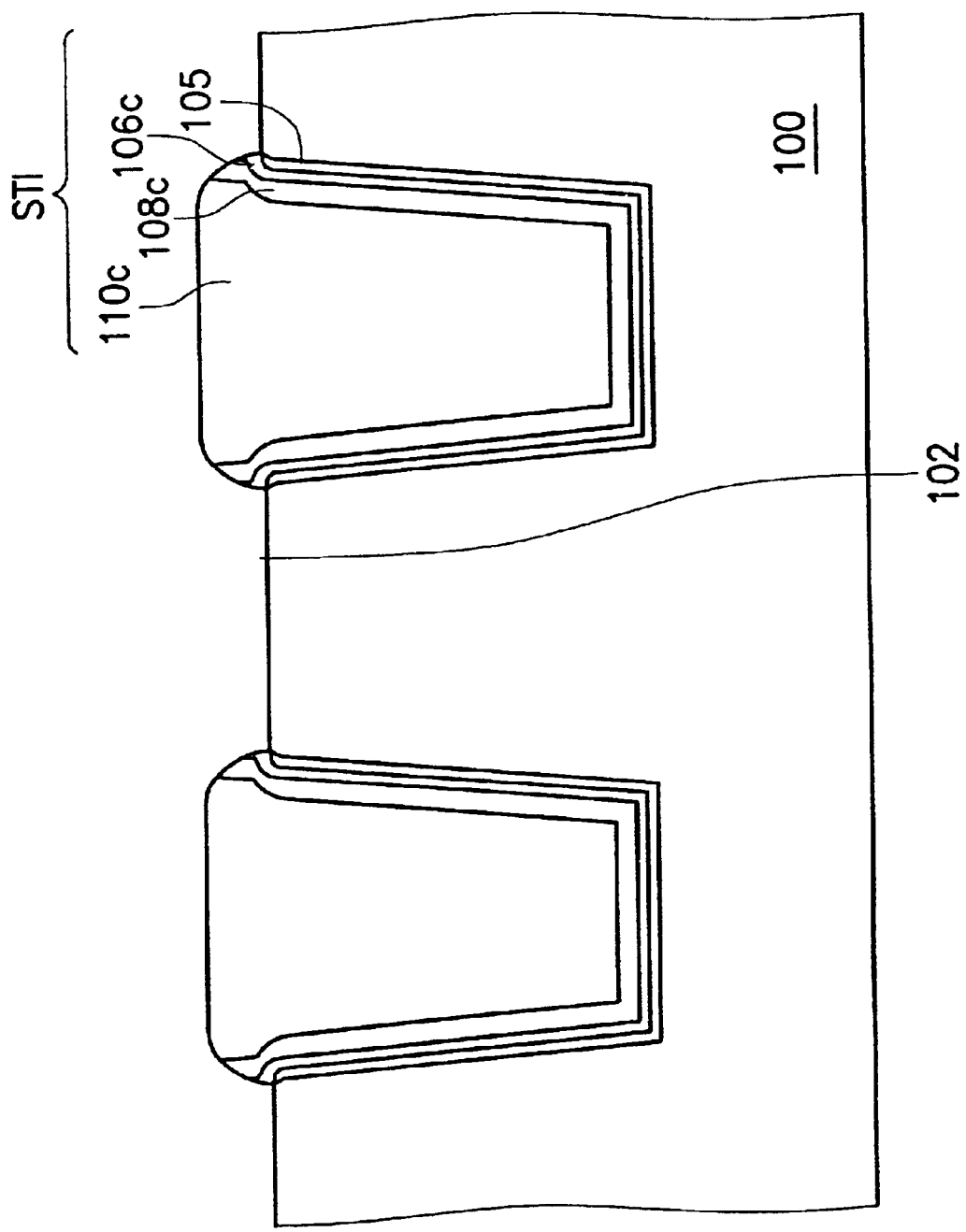

Afterward, as shown in FIG. 8, the pad oxide 102 is removed by a hydrofluoric acid solution to leave a shallow trench isolation STI consisting of thermal oxide film 105, nitride liner 106c, and silicon rich oxide 108c, and silicon oxide 110c.

According to the method of the invention, corner erosion of shallow trench isolation can be eliminated thus improving the performance of the semiconductor device.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method of forming a shallow trench isolation in a semiconductor substrate, comprising the steps of:
   (a) forming a hard mask consisting of a pad nitride and a pad oxide on the semiconductor substrate;
   (b) etching the semiconductor substrate to form a trench while the hard mask is used as the etching mask;
   (c) forming a thermal oxide film on the trench;
   (d) forming a nitride liner on the thermal oxide film;
   (e) conformally depositing a silicon rich oxide layer on the nitride liner by high density plasma chemical vapor deposition without a bias voltage applied to the semiconductor substrate; and
   (f) forming a silicon oxide to fill the trench by high density plasma chemical vapor deposition while a bias voltage is applied to the semiconductor substrate.

2. The method of forming a shallow trench isolation in a semiconductor substrate as claimed in claim 1, wherein the deposition gas in step (e) includes a mixture gas of silane and oxygen having a flow ratio of about 1:1.

3. The method of forming a shallow trench isolation in a semiconductor substrate as claimed in claim 1, wherein the deposition gas in step (f) includes a mixture gas of silane and oxygen having a flow ratio of about 1:1 to 1:2.

4. The method of forming a shallow trench isolation in a semiconductor substrate as claimed in claim 1, wherein the silicon rich oxide layer has a hydrofluoric acid selectivity of about 1 relative to the silicon oxide layer.

5. The method of forming a shallow trench isolation in a semiconductor substrate as claimed in claim 1, wherein the silicon rich oxide layer has a hydrofluoric acid selectivity less than 1 relative to the silicon oxide layer.

6. The method of forming a shallow trench isolation in a semiconductor substrate as claimed in claim 1, further comprising the steps of:
   planarizing the silicon rich oxide layer and the silicon oxide layer by chemical mechanical polishing while the hard mask is used as the polishing stop layer; and
   removing residual oxide above the hard mask by hydrofluoric acid.

7. The method of forming a shallow trench isolation in a semiconductor substrate as claimed in claim 1, wherein the nitride liner is a silicon nitride film formed by chemical vapor deposition.

\* \* \* \* \*